United States Patent
Kang

(10) Patent No.: US 8,788,894 B2
(45) Date of Patent: Jul. 22, 2014

(54) METHOD OF ENHANCING ERROR CORRECTION PERFORMANCE AND STORAGE DEVICE USING THE METHOD

(75) Inventor: Nam-wook Kang, Hwaseong-Si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 200 days.

(21) Appl. No.: 13/547,340

(22) Filed: Jul. 12, 2012

(65) Prior Publication Data

US 2013/0117630 A1    May 9, 2013

(30) Foreign Application Priority Data

Nov. 4, 2011    (KR) .................. 10 2011 0114508

(51) Int. Cl.
  *G11C 29/00*  (2006.01)
  *G01R 31/3193*  (2006.01)
  *G06F 11/10*  (2006.01)

(52) U.S. Cl.
  CPC ...... *G01R 31/31935* (2013.01); *G06F 11/1072* (2013.01); *G11C 29/00* (2013.01); *G11C 29/006* (2013.01)
  USPC ........................................ 714/723

(58) Field of Classification Search
  CPC . G01R 31/31935; G11C 29/00; G11C 29/006
  USPC .................. 714/702, 719, 723, 763
  See application file for complete search history.

(56) References Cited

U.S. PATENT DOCUMENTS

| | | | |
|---|---|---|---|
| 5,644,578 A * | 7/1997 | Ohsawa | 714/719 |
| 5,854,796 A | 12/1998 | Sato | |
| 6,564,346 B1 * | 5/2003 | Vollrath et al. | 714/723 |
| 8,489,817 B2 * | 7/2013 | Flynn et al. | 711/128 |
| 2010/0180179 A1 | 7/2010 | Lastras-Montano | |

FOREIGN PATENT DOCUMENTS

| | | |
|---|---|---|
| JP | 2008-123160 A | 5/2008 |
| KR | 20110073932 A | 6/2011 |

\* cited by examiner

*Primary Examiner* — Shelly A Chase
(74) *Attorney, Agent, or Firm* — Harness, Dickey & Pierce, P.L.C.

(57) ABSTRACT

A method of enhancing an error correction performance in a data storage system, and a storage device using the method, determines a deterioration status of a physical area of a memory device to which data is to be stored and compresses data and stores the compressed data and an error correction code (ECC) with respect to the compressed data in an area of which the deterioration status is equal to or greater than a threshold value that is initially set and stores uncompressed data and an ECC with respect to the uncompressed data in an area of which the deterioration status is less than the threshold value.

15 Claims, 17 Drawing Sheets

METHOD OF ENHANCING ERROR CORRECTION PERFORMANCE AND STORAGE DEVICE USING THE METHOD

CROSS-REFERENCE TO RELATED APPLICATIONS

This application claims the benefit of Korean Patent Application No. 10-2011-0114508, filed on Nov. 4, 2011, in the Korean Intellectual Property Office, the disclosure of which is incorporated herein in its entirety by reference.

BACKGROUND

At least one example embodiment of the inventive concepts relates to a method and/or apparatus for enhancing an error correction performance in a data storage system.

A non-volatile memory device is a memory device capable of retaining stored information although a power is cut. Examples of the non-volatile memory device may include a flash memory and the like. However, in the non-volatile memory device such as the flash memory, an error occurrence rate increases as the number of times of use or a time period of use increases. Accordingly, there is a demand for enhancing an error correction performance by using an error correction code having a limited size in a storage device to which the non-volatile memory device is applied.

SUMMARY

At least one example embodiment of the inventive concepts provide a method of enhancing an error correction performance by selectively compressing data to be stored in a storage device and then storing the data, whereby the error correction performance is enhanced.

At least one example embodiment of the inventive concepts provides a storage device that selectively compresses and stores data to enhance an error correction performance.

According to an example embodiment of the inventive concepts, there is provided a method of enhancing an error correction performance, the method including operations of determining a deterioration status of a physical area of a memory device to which data is to be stored; and compressing data and storing the compressed data and an error correction code (ECC) with respect to the compressed data in an area of which the deterioration status is equal to or greater than a threshold value that is initially set, and storing uncompressed data and an ECC with respect to the uncompressed data in an area of which the deterioration status is less than the threshold value.

A size of the ECC stored in the area of which the deterioration status is equal to or greater than the threshold value, and a size of the ECC stored in the area of which the deterioration status is less than the threshold value may be the same.

The deterioration status may be determined by at least one of a unit of page, a unit of block or a unit of plane of the memory device to which the data is to be stored.

The deterioration status may be determined based on at least one of error bit information, program/erase cycle information, and program/read count information.

If the deterioration status of the physical area of the memory device that corresponds to a physical address to which the data is to be stored is less than the threshold value, the operation of storing may include operations of generating a first ECC with respect to the data; and writing the data and the first ECC to a storage area of the memory device that is assigned by the physical address.

If the deterioration status of the physical area of the memory device that corresponds to a physical address to which the data is to be stored is equal to or greater than the threshold value, the operation of storing may include operations of compressing the data; performing a padding operation on the compressed data by using ineffective data that is initially set, to allow a size of the compressed data and a size of the uncompressed data to be equal to each other; generating a second ECC with respect to the compressed data that is padded; and writing the compressed data and the second ECC to a storage area of the memory device that is assigned by the physical address.

The value of all bits in the ineffective data may be initially set to 0.

The compressed data may be repeatedly written to a plurality of different positions in a page assigned by the physical address.

The compressed data may be repeatedly written to a first page assigned by the physical address and a second page different from the first page.

The method may further include an operation of writing information to metadata, wherein the information is related to an area of the memory device of which the deterioration status is equal to or greater than the threshold value.

According to another example embodiment of the inventive concepts, there is provided a storage device including a memory device configured to store information; and a memory controller configured to determine a deterioration status of each of areas of the memory device by referring to management information regarding the memory device, configured to compress data and write the compressed data and an error correction code (ECC) with respect to the compressed data to the memory device if the deterioration status of a storage area of the memory device that corresponds to a physical address to which the data is to be stored is equal to or greater than a threshold value that is initially set, and configured to write uncompressed data and an ECC with respect to the uncompressed data to the memory device if the deterioration status of the storage area of the memory device is less than the threshold value.

The memory device may include a flash memory device.

The memory controller may include a volatile memory means configured to temporarily store management information regarding the memory device and first data to be stored in the memory device; a compression processing unit configured to receive the first data and generating compressed first data; an ECC processing unit configured to generate a first ECC with respect to the first data and a second ECC with respect to the compressed first data; and a control unit configured to translate a logical address into a physical address, wherein data is to be stored in the logical address, to determine the deterioration status of a storage area of the memory device based on management information regarding the memory device, wherein the storage area of the memory device corresponds to the physical address, to write the compressed first data and the second ECC to the physical address of the memory device if the deterioration status is equal to or greater than the threshold value, and to write the first data and the first ECC to the physical address of the memory device if the deterioration status is less than the threshold value.

The management information may include at least one of error bit information, program/erase cycle information and program/read count information that are computed by a unit of area that is initially set.

The memory controller may control the data to be compressed and then to be repeatedly written to a plurality of different positions in the memory device, when the deterioration status of the storage area of the memory device is equal to or greater than the threshold value, wherein the storage area of the memory device corresponds to the physical address to which the data is to be stored.

According to an example embodiment, there is provided a method of enhancing an error correction performance, the method including operations of determining a deterioration status of a physical area of a memory device; and compressing data and storing the compressed data and an error correction code (ECC) if the deterioration status of the physical area is equal to or greater than a threshold value, and storing uncompressed data and an ECC if the deterioration status of the physical area is less than the threshold value.

A size of the ECC stored if the deterioration status is equal to or greater than the threshold value may be the same as a size of the ECC stored if the deterioration status is less than the threshold value.

The deterioration status may be determined based on at least one of error bit information, program/erase cycle information, and program/read count information.

If the deterioration status of the physical area is less than the threshold value, the operation of storing may include operations of generating a first ECC with respect to the data; and writing the data and the first ECC to a storage area of the memory device that is assigned by the physical address.

If the deterioration status of the physical area is equal to or greater than the threshold value, the operation of storing may include operations of compressing the data; performing a padding operation on the compressed data by using ineffective data that is initially set, to allow a size of the compressed data and a size of the uncompressed data to be equal to each other; generating a second ECC with respect to the compressed data that is padded; and writing the compressed data and the second ECC to a storage area of the memory device that is assigned by the physical address.

BRIEF DESCRIPTION OF THE DRAWINGS

Example embodiments of the inventive concepts will be more clearly understood from the following detailed description taken in conjunction with the accompanying drawings in which:

FIGS. 16(a) through 16(c) illustrates an example of a process of processing data stored in an area of which data deterioration status is less than a threshold value according to an example embodiment of the inventive concepts;

FIGS. 17(a) through 17(c) illustrates an example of a process of processing data stored in an area of which data deterioration status is equal to or greater than the threshold value according to an example embodiment of the inventive concepts;

FIGS. 18(a) through 18(d) illustrates an example of a process of processing data stored in an area of which data deterioration status is equal to or greater than a threshold value according to another example embodiment of the inventive concepts;

FIGS. 19(a) through 19(e) illustrates an example of a process of processing data stored in an area of which data deterioration status is equal to or greater than a threshold value according to another example embodiment of the inventive concepts;

FIGS. 20(a) and 20(b) illustrates an example of data storage areas before and after data compression in the memory device according to an example embodiment;

Figure 1:
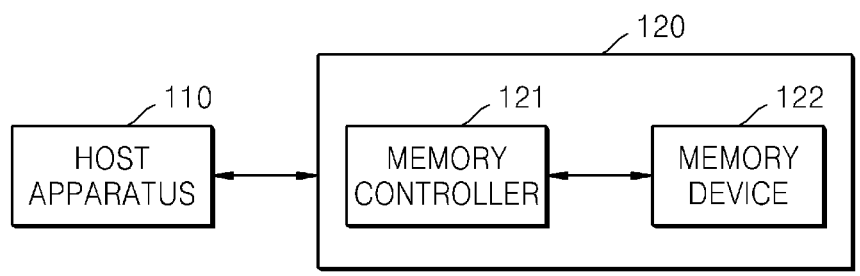
FIG. 1 is a configuration diagram illustrating an example of a data storage system according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION

Example embodiment of the inventive concepts will now be described more fully with reference to the accompanying drawings, in which example embodiments of the inventive concepts are shown. The inventive concepts may, however, be embodied in many different forms and should not be construed as being limited to the example embodiments set forth herein; rather, these example embodiments are provided so that this disclosure will be thorough and complete, and will fully convey example embodiments of the inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Furthermore, all examples and conditional language recited herein are to be construed as being without limitation to such specifically recited examples and conditions. Throughout the specification, a singular form may include plural forms, unless there is a particular description contrary thereto. Terms such as "comprise," "comprising," "included" and "including" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

Unless expressly described otherwise, all terms including descriptive or technical terms which are used herein should be construed as having meanings that are obvious to one of ordinary skill in the art. Terms that are defined in a general dictionary and that are used in the following description should be construed as having meanings that are equivalent to meanings used in the related description, and unless expressly described otherwise herein, the terms should not be construed as being ideal or excessively formal.

Expressions such as "at least one of," when preceding a list of elements, modify the entire list of elements and do not modify the individual elements of the list.

FIG. 1 is a configuration diagram illustrating an example of a data storage system 100 according to an example embodiment of the inventive concepts.

As illustrated in FIG. 1, the data storage system 100 includes a host apparatus 110 and a storage device 120.

Figure 2:
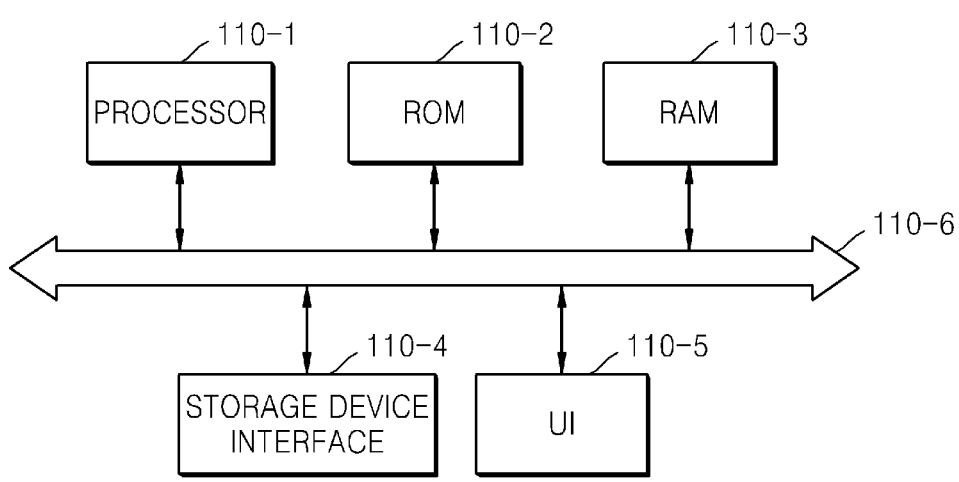
FIG. 2 is a block diagram illustrating an example of the host apparatus of FIG. 1 according to an example embodiment.

A detailed structure of the host apparatus 110 is illustrated in FIG. 2.

As illustrated in FIG. 2, the host apparatus 110 includes a processor 110-1, a read only memory (ROM) 110-2, a random access memory (RAM) 110-3, a storage device interface 110-4, a user interface (UI) 110-5, and a bus 110-6.

The bus 110-6 means a transmission path for transmitting data between configuring means in the host apparatus 110.

The ROM 110-2 has various application programs stored therein. For example, application programs including an advanced technology attachment (ATA), a small computer system interface (SCSI), an embedded multimedia card (eMMC), a unix file system (UFS) or the like that support a storage protocol are stored in the ROM 110-2.

The RAM 110-3 temporarily stores data or programs.

The UI 110-5 is a physical or virtual mediator that is capable of exchanging information among a user, the host apparatus 110, and a computer program and that includes physical hardware and logical software. For example, the UI 110-5 may include an input device for allowing the user to manipulate the host apparatus 110 and an output device for displaying a process result about a user input.

The processor 110-1 controls all operations of the host apparatus 110. The processor 110-1 may generate a command to store data in the storage device 120 or a command to read data from the storage device 120, by using an application or a tool stored in the ROM 110-2, and then may allow the command to be delivered to the storage device 120 via the storage device interface 110-4.

The storage device interface 110-4 may include an interface such as an ATA interface, a serial advanced technology attachment (SATA) interface, a parallel advanced technology attachment (PATA) interface, a universal serial bus (USB) interface, a serial attached small computer system (SAS) interface, a SCSI interface, an eMMC interface, an UFS interface or the like that support a storage protocol.

Referring to FIG. 1, the storage device 120 includes a memory controller 121 and a memory device 122.

If the memory device 122 is formed as a non-volatile semiconductor memory such as a flash memory, the memory device 122 may be a solid state drive (SSD). The memory controller 121 controls an erasing operation, a read operation or a write operation of the memory device 122, in response to a command output from the host apparatus 110.

Figure 3:
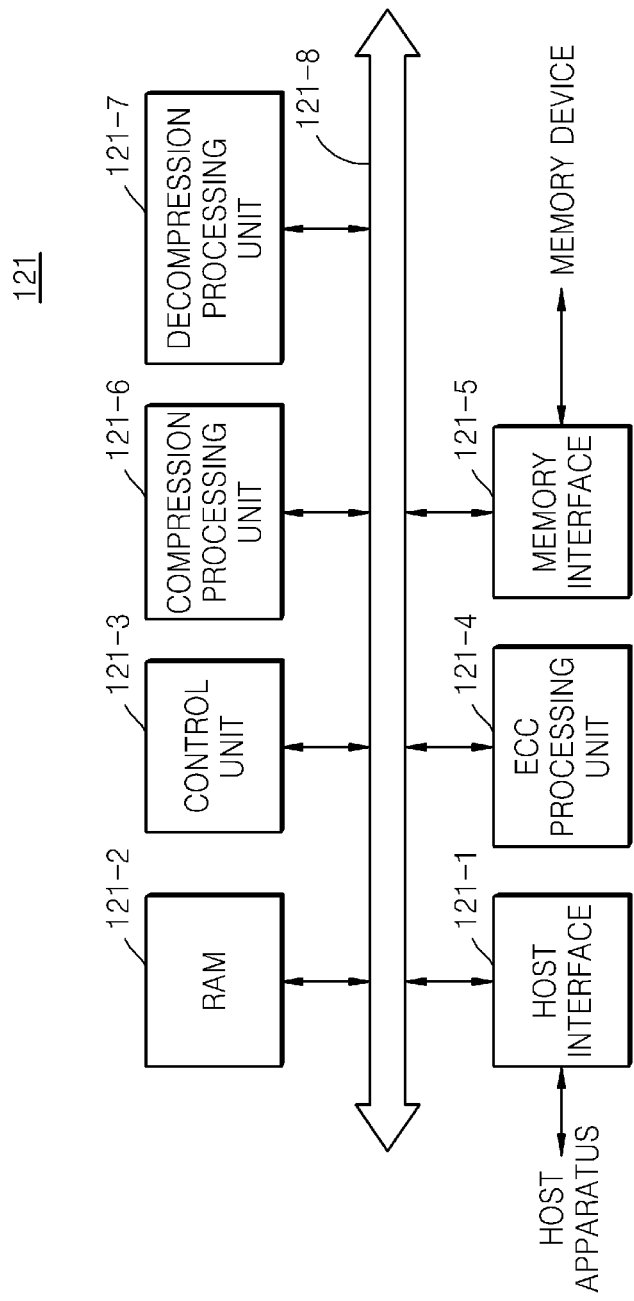
FIG. 3 is a block diagram illustrating an example of the memory controller of FIG. 1 according to an example embodiment.

A detailed structure of the memory controller 121 is illustrated in FIG. 3.

As illustrated in FIG. 3, the memory controller 121 includes a host interface 121-1, a RAM 121-2, a control unit 121-3, an error correction code (ECC) processing unit 121-4, a memory interface 121-5, a compression processing unit 121-6, a decompression processing unit 121-7, and a bus 121-8.

The bus 121-8 means a transmission path for transmitting data between configuring means in the memory controller 121.

The control unit 121-3 controls all operations of the storage device 120. The control unit 121-3 interprets the command output from the host apparatus 110, and controls the storage device 120 to perform an operation according to a result of the interpretation.

The host interface 121-1 has a data exchange protocol for the host apparatus 110 connected to the storage device 120, and connects the storage device 120 and the host apparatus 110. The host interface 121-1 may be implemented as one of an ATA interface, a SATA interface, a PATA interface, a USB interface, a SAS interface, a SCSI interface, an eMMC interface, and an UFS interface. However, the implementation of the host interface 121-1 is not limited to the aforementioned interfaces. The host interface 121-1 exchanges a command, an address, and data with the host apparatus 110 according to a control by the control unit 121-3.

The RAM 121-2 temporarily stores data that is transmitted from the host apparatus 110 and data that is generated in the control unit 121-3 or temporarily stores data that is read from the memory device 122. The RAM 121-2 stores metadata read from the memory device 122. The RAM 121-2 may be formed as a dynamic random access memory (DRAM), a static random access memory (SRAM) or the like.

The metadata is information generated in the storage device 120 to manage the memory device 122. The metadata that is management information includes mapping information used to translate a logical address into a physical address of the memory device 122. The metadata may include a plurality of pieces of information to be used in determination of deterioration of each of areas in the memory device 122. For example, the information to be used in determination of deterioration of each of areas in the memory device 122 may include error bit information by an ECC algorithm, program/erase cycle information or program/read count information. If the memory device 122 is formed as a flash memory, the metadata may include an error bit count value for each block, an erase count value for each block, and a program/read count value for each block. In another example, the metadata may include an error bit count value for each plane, an erase count value for each plane, and a program/read count value for each plane. In another example, the metadata may include an error bit count value for each cell.

The metadata may include a plurality of pieces of information for management of a storage space of the memory device 122.

The memory interface 121-5 is electrically connected to the memory device 122. The memory interface 121-5 exchanges a command, an address, and data with the memory device 122 according to a control by the control unit 121-3. The memory interface 121-5 may support a NAND flash memory or a NOR flash memory. The memory interface 121-5 may be formed so that software and hardware interleave operations may be selectively performed via a plurality of channels.

In a read operation, the control unit 121-3 provides a read command and an address to the memory device 122, and in a write operation, the control unit 121-3 provides a write command, an address, and data to the memory device 122. The control unit 121-3 translates a logical address into a physical address by using the metadata stored in the RAM 121-2, wherein the logical address is received from the host apparatus 110.

When a power is supplied to the storage device 120, the control unit 121-3 controls the storage device 120 to read metadata stored in the memory device 122 and then to store the metadata in the RAM 121-2. The control unit 121-3 controls the storage device 120 to update the metadata stored in the RAM 121-2 according to an operation for changing metadata in the memory device 122. The control unit 121-3 controls the metadata stored in the RAM 121-2 to be written to the memory device 122 before a power is cut off in the storage device 120.

According to a control by the control unit 121-3, the compression processing unit 121-6 selectively compresses data to be stored in the memory device 122, based on a deterioration status of a physical area of the memory device 122. Compression target data may be writable data provided from various application program files and the host apparatus 110. Obviously, the compression target data may also include metadata.

The compression processing unit 121-6 may compress data by using a run-length encoding method or a Huffman coding method. The run-length encoding method expresses a type of data, and a repeated number when the same value consecutively occurs in the data.

The decompression processing unit 121-7 receives compressed data and restores it to a state before the compression is performed, according to a control by the control unit 121-3. The decompression processing unit 121-7 may perform the restoring operation on the compressed data by reversely using a compression theory of the compression processing unit 121-6.

In a write operation, the ECC processing unit 121-4 may generate an ECC with respect to received data by using an algorithm such as a Reed-Solomon code (RS code), a Hamming code, a cyclic redundancy code (CRC) or the like. In a read operation, the ECC processing unit 121-4 performs error detection and correction processing on the received data by using the ECC read together with data.

If the same ECC algorithm is used, an error correction strength per a size of a unit data is increased, in proportion to a size of the ECC. For example, in an ECC algorithm that processes a bit error of 1024 byte data by a level equal to or less than 16 bit, if the ECC algorithm requires an ECC size of 112 byte per 4 kilobyte (KB) page, in an ECC algorithm that processes a bit error of 1024 byte data by a level equal to or less than 32 bit, the ECC algorithm requires an ECC size of 224 byte per 4 KB page. For example, in order to enhance a bit error of the error correction strength, which can be processed per 4 KB page, from 16 bit to 32 bit, it is necessary to double the ECC size.

In an example embodiment, an ECC strength is enhanced without changing an ECC algorithm but using the same ECC algorithm. For example, data that is stored in an area of which deterioration status is severe from among storage areas of the memory device 122 is compressed, and then the ECC algorithm is applied to the compressed data. By doing so, an effective data size of a data period to which an ECC is applied is decreased and the ECC strength is enhanced.

The ECC processing unit 121-4 performs padding on the compressed data output from the compression processing unit 121-6 by using ineffective data, applies the ECC algorithm to the padded compressed data, and then generates the ECC. The padding may be performed by adding the ineffective data that is initially set to the compressed data in order to allow sizes of the compressed data and decompressed data to be equal to each other. In one example, the value of all bits in the ineffective data may be in initially set to 0. In another example, the value of all bits in the ineffective data may be initially set to 1.

For data that is not compressed and is input without passing through the compression processing unit 121-6, the ECC processing unit 121-4 generates an ECC by directly applying the ECC algorithm to the data. The same ECC algorithm is applied to the padded compressed data and the uncompressed data. This means that, if the ECC algorithm that processes a bit error of 1024 byte data by a level equal to or less than 16 bit is applied to the uncompressed data, the ECC algorithm that processes a bit error of 1024 byte data by a level equal to or less than 16 is also applied to the padded compressed data. Thus, an effective data size to which the ECC is applied is decreased in the compressed data, so that the ECC strength is enhanced.

The control unit 121-3 determines a deterioration status of each area of the memory device 122 by referring to metadata that is management information about the memory device 122, and if the deterioration status of a storage area of the memory device 122 which corresponds to a physical address to which data is to be stored is equal to or greater than an initially-set threshold value, the control unit 121-3 controls the storage device 120 to compress data and to write the compressed data and an ECC regarding the compressed data to the memory device 122, and if not, the control unit 121-3 controls the storage device 120 to write uncompressed data and an ECC regarding the uncompressed data to the memory device 122.

A method of enhancing an error correction performance performed according to control operations by the control unit 121-3 will be described in detail with reference to FIGS. 8 through 15.

Referring to FIG. 1, the memory device 122 may be formed as a non-volatile semiconductor memory device, and the memory device 122 may be formed as a phase change RAM (PRAM), a ferroelectric RAM (FRAM), a magnetic RAM (MRAM), and the like.

Figure 4:
FIG. 4 illustrates an example of a structure of an information storage area of a memory device of FIG. 1 according to an example embodiment.

Referring to FIG. 4, a storage area of the memory device 122 may be divided into a fixed information area 41, a root information area 42, and a data area 43.

In the fixed information area 41, unique information about the memory device 122 may be stored, and examples of the unique information may include information, a version, the number of pages per a block, and the like about a file system. In the data area 43, metadata and user data are stored. The data area 43 may be divided into a metadata storage area and a user data area. The user data area may be divided into a data storage area and a spare area, and an ECC may be stored in the spare area.

Figure 5:
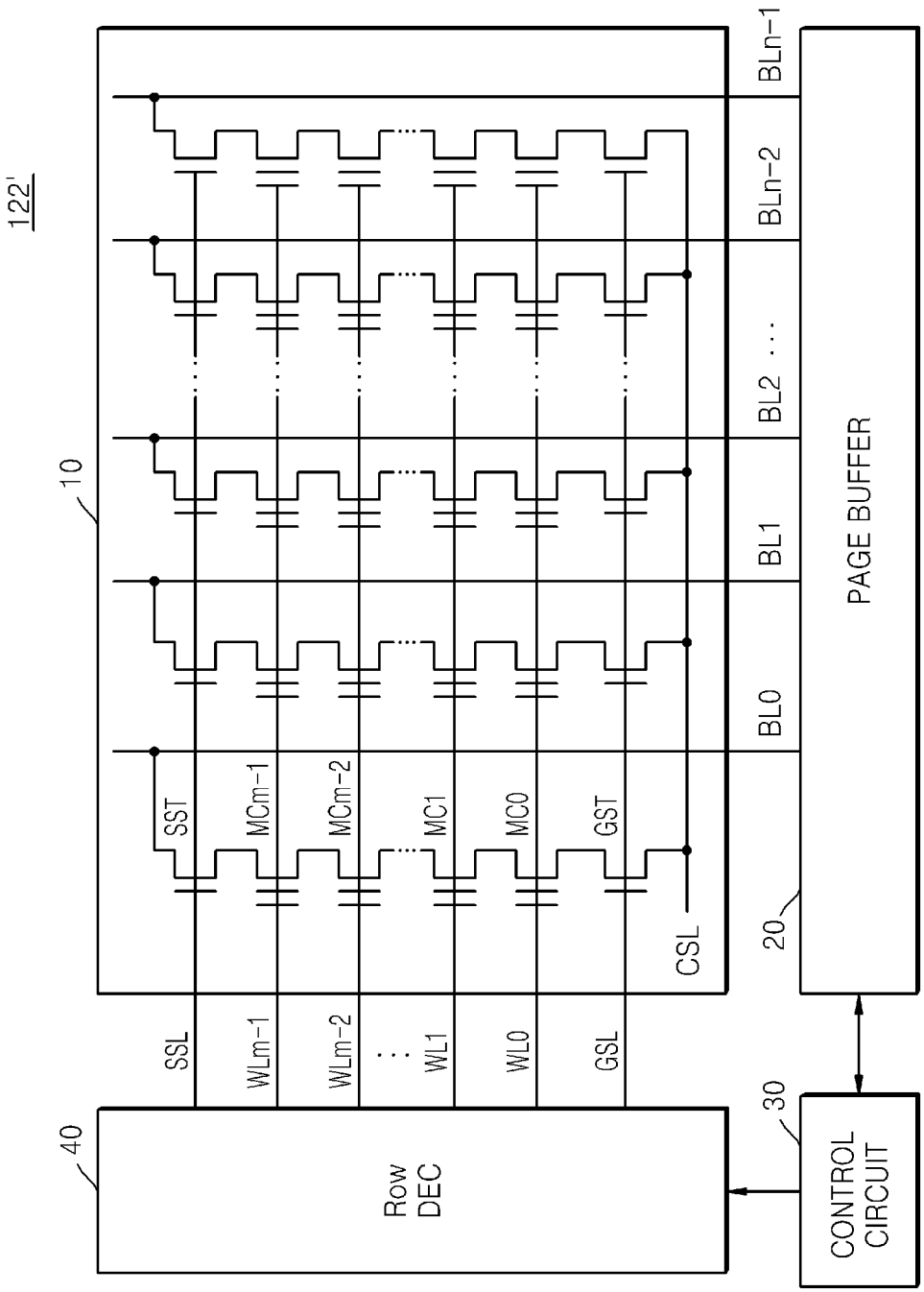
FIG. 5 illustrates an example of a detailed structure of the memory device of FIG. 1 according to an example embodiment.

FIG. 5 illustrates an example of a detailed structure of the memory device 122 that is formed as a flash memory 122', according to an example embodiment of the inventive concepts.

Referring to FIG. 5, the flash memory 122' includes a cell array 10, a page buffer 20, a control circuit 30, and a row decoder 40.

The cell array 10 corresponds to an area to which data is written by applying a predetermined voltage to a transistor. The cell array 10 includes memory cells formed at points where wordlines WL0 through WLm-1 and bitlines BL0 through BLn-1 cross each other, respectively. m and n indicate natural numbers. Although FIG. 5 illustrates one memory block, the cell array 10 may include a plurality of memory blocks. Each of the memory blocks includes pages corresponding to the wordlines WL0 through WLm-1, respectively. Each of the pages includes a plurality of memory cells connected to a corresponding wordline from among the wordlines WL0 through WLm-1. The flash memory 122' performs an erasing operation by a unit of block, and performs a program operation or a read operation by a unit of page.

The cell array 10 has a cell string structure. Each cell string includes a string selection transistor SST connected to a string selection line SSL, a plurality of memory cells MC0 through MCm-1 connected to the wordlines WL0 through WLm-1, respectively, and a ground selection transistor GST connected to a ground selection line GSL. The string selection transistor SST is connected between a bitline and a string channel, and the ground selection transistor GST is connected between the string channel and a common source line CSL.

The page buffer 20 is connected to the cell array 10 via the bitlines BL0 through BLn-1. The page buffer 20 temporarily stores data to be written to memory cells connected to a selected wordline or temporarily stores data read from memory cells connected to a selected wordline.

The control circuit 30 generates various voltages required to perform a write operation, a read operation, and an erasing operation, and receives control signals, thereby controls all operations of the flash memory 122'.

The row decoder 40 is connected to the cell array 10 via selection lines (i.e., the string selection line SSL and the ground selection line GSL), and the wordlines WL0 through WLm-1. The row decoder 40 receives an address in a write operation or a read operation, and selects one of the wordlines WL0 through WLm-1 according to the received address. The wordline that is selected from the wordlines WL0 through WLm-1 is connected to a plurality of memory cells to which a write operation or a read operation is performed.

The row decoder 40 applies the voltages (e.g., a program voltage, a pass voltage, a read voltage, a string selection voltage, and a ground selection voltage) that are required to perform a program operation or a read operation to the selected wordline, not-selected wordlines, and the selection lines SSL and GSL.

Each of the memory cells may store one-bit data or data equal to or greater than two-bit. The memory cell that stores one-bit data is referred to as a single level cell (SLC). The memory cell that stores data equal to or greater than two-bit is referred to as a multilevel cell (MLC). The SLC has an erase state or a program state according to a threshold voltage.

Reliability of a flash memory formed of the MLCs may deteriorate due to factors including the time period of use, a program/erase cycle, and the like, so that an ECC correction disability status may occur in the flash memory formed of the MLCs. A spare area exists in a physical page of the flash memory and ECC information is stored in the spare area. If an ECC size is increased to solve the problem in which the reliability deteriorates due to the time period of use, the program/erase cycle, and the like, the spare area of the flash memory may have to be increased or a space for storing data for another purpose may be decreased in the spare area.

One or more example embodiments of the inventive concepts provide a method of enhancing an error correction strength without changing an ECC algorithm to enhance reliability of a storage device. The error correction strength is enhanced in a manner that page data is compressed according to a deterioration status of each area of an MLC or a SLC, and the ECC algorithm is applied to the compressed page data. The compressed page data may be copied and stored by using a residual space obtained via the compression. The deterioration status may be determined by a unit of page, a unit of block or a unit of plane.

Figure 6:
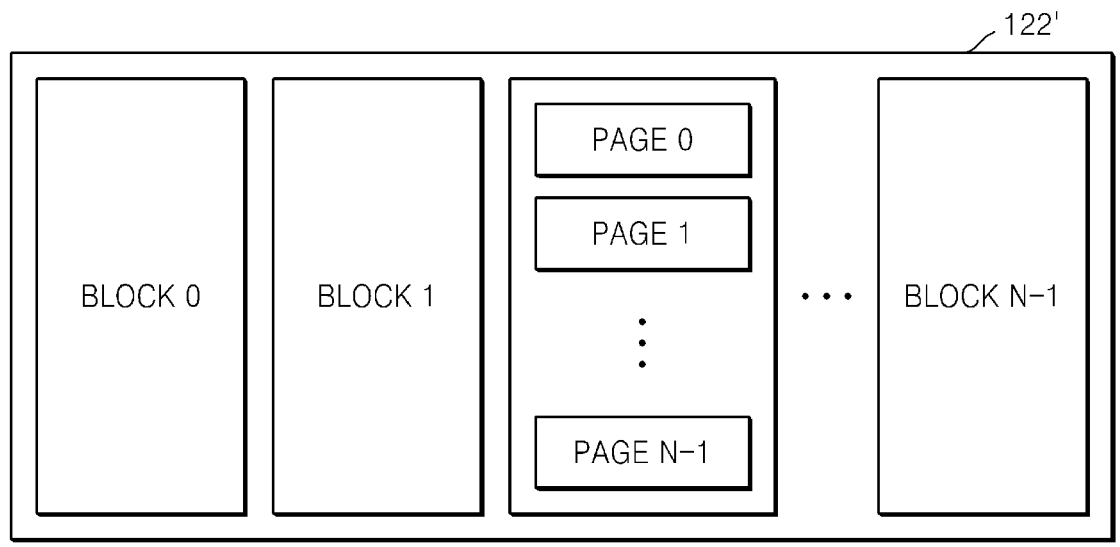
FIG. 6 is a conceptual diagram illustrating an example of an internal storage structure of a flash memory according to an example embodiment.

As illustrated in FIG. 6, an inner structure of the flash memory 122' is formed of a plurality of blocks, and each of the blocks is formed of a plurality of pages.

In the flash memory 122', a write operation and a read operation with respect to data are performed by a unit of pages, and an electrical erasing operation is performed in a unit of blocks. Before the read operation, it is required to electrically erase a block. Thus, an overwrite operation is impossible.

In a non-overwritable memory device, it is impossible to write user data to a user-desired physical area. Thus, when the non-overwritable memory device receives an access request regarding a write operation or a read operation from a user, it is necessary to perform an address translating operation for translating a logical address with respect to the user data into a physical address by classifying an area to which the write operation or the read operation from the user is requested into the logical address, and a physical area that actually stores data or that will store data into the physical address.

A process performed in the data storage system 100 to translate a logical address into a physical address will now be described with reference to FIG. 7.

Figure 7:
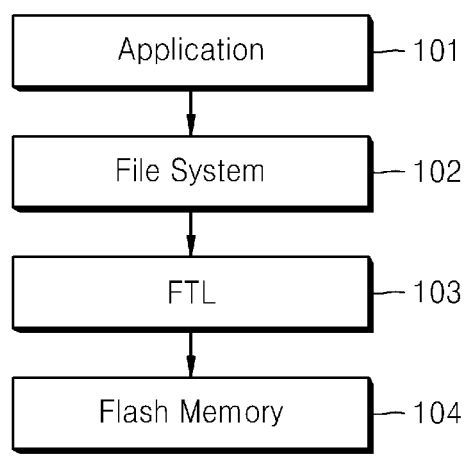
FIG. 7 is a block diagram illustrating an example of a software structure in the data storage system according to an example embodiment.

FIG. 7 is a block diagram illustrating an example of a software structure in the data storage system 100. For example, FIG. 7 illustrates an example of the software structure in the data storage system 100 when the memory device 122 that forms the data storage system 100 is formed as a flash memory.

Referring to FIG. 7, the data storage system 100 has a software layer structure in the order of an application 101, a file system 102, a flash translation layer (FTL) 103, and a flash memory 104. The flash memory 104 means the flash memory 122' that is physically illustrated in FIGS. 5 and 6.

The application 101 means a firmware that processes user data in response to a user input via the UI 110-5. For example, the application 101 may include document processing software such as a word processor program, calculation software, a document viewer such as a web browser or the like. The application 101 processes the user data in response to the user input and delivers a command to the file system 102, wherein the command is used to store the processed user data in the flash memory 104.

The file system 102 means a structure or software that is used to store the user data in the flash memory 104. The file system 102 allocates a logical address to which the user data is to be stored, in response to the command from the application 101. Examples of the file system 102 include a file allocation table (FAT) file system, a new technology file system (NTFS) or the like.

The FTL 103 performs a translation process in which the logical address received from the file system 102 is translated into a physical address for read and write operations in the flash memory 104. The FTL 103 translates the logical address into the physical address by using mapping information included in metadata. An address mapping method may include a page mapping method, a block mapping method or the like. The page mapping method performs an address mapping operation by a unit of pages, and the block mapping method performs an address mapping operation by a unit of blocks. A combination mapping method may be performed by combining the page mapping method and the block mapping method. The physical address indicates a data storage location in the flash memory 104.

Figure 8:
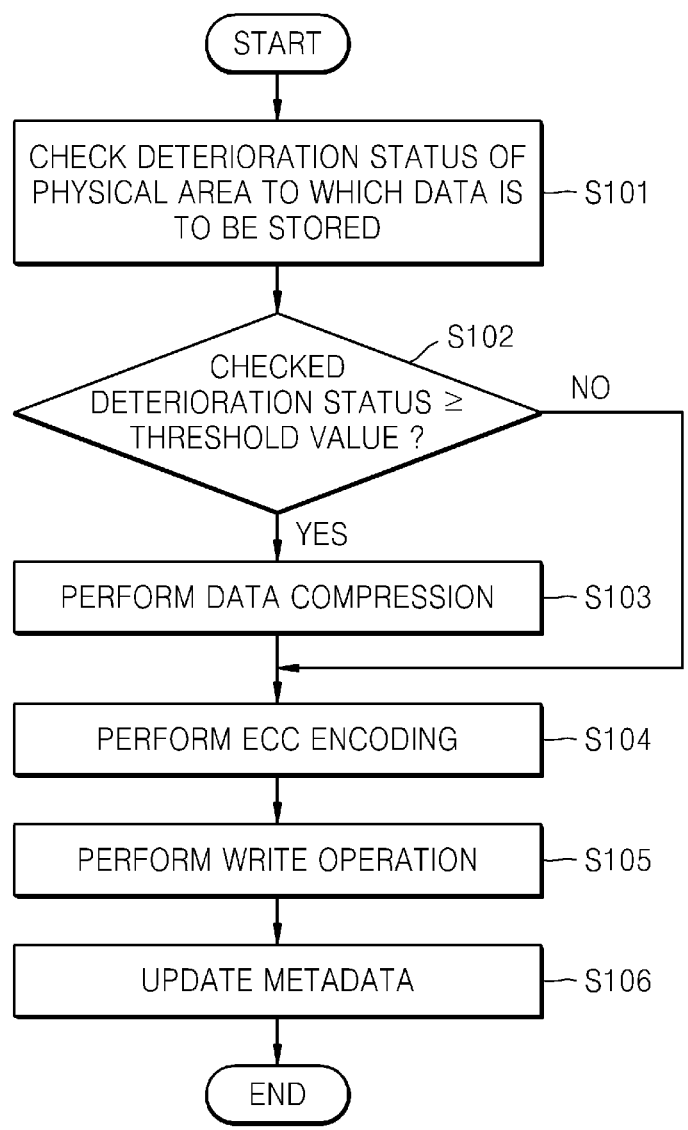
FIG. 8 is a flowchart illustrating an example of a method of enhancing an error correction performance according to an example embodiment of the inventive concepts.

FIG. 8 is a flowchart illustrating an example of a method of enhancing an error correction performance according to an example embodiment of the inventive concepts. The method of enhancing an error correction performance in FIG. 8 may be performed via a control operation by the control unit 121-3 of the memory controller 121 shown in FIG. 3. For convenience of description, it is assumed that the memory device 122 of FIG. 1 is the flash memory 122'. However, the memory device 122 is not limited to a flash memory and thus may be one of various non-volatile memory devices.

The control unit 121-3 checks a deterioration status of a physical area of the flash memory 122' to which data is to be stored (operation S101). For example, the control unit 121-3 may check a deterioration status of a page, a block or a plane based on metadata stored in the RAM 121-2, wherein the page, the block or the plane corresponds to a physical address of the flash memory 122' to store data. For example, the deterioration status may be checked based on an error bit count value, an erase count value or a program/read count value with respect to the page, the block or the plane, which is to store data included in the metadata.

The control unit 121-3 compares the deterioration status checked in operation S101 with a threshold value that is initially set (operation S102). The threshold value may be set as a value having a certain margin value in a maximum deterioration status in which error correction is guaranteed by an ECC algorithm applied to the storage device 120. If the deterioration status is equal to or greater than the threshold value, this means that a wearing level status of a corresponding physical area is not good. If the deterioration status is less than the threshold value, this means that the wearing level status of the corresponding physical area is good.

As a result of the comparison in operation S102, when the deterioration status is equal to or greater than the threshold value, data compression is performed according to a control by the control unit 121-3 (operation S103). For example, data to be stored in the flash memory 122 is read from the RAM 121-2 and then is delivered to the compression processing unit 121-6 according to the control by the control unit 121-3. The compression processing unit 121-6 compresses the data by using the run-length encoding method or the Huffman coding method.

ECC encoding is performed according to the control by the control unit 121-3 (operation S104). The data is written to the flash memory 122' (operation S105). Operations S104 and S105 will be described in detail with reference to FIGS. 9 through 11.

Figure 9:
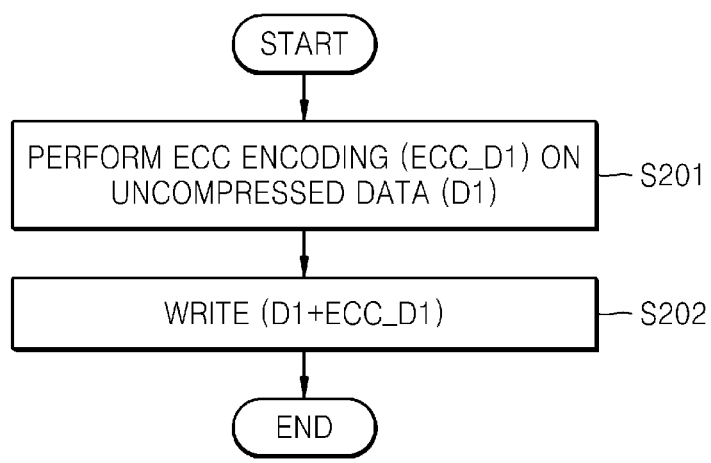
FIG. 9 is a flowchart illustrating an example of a process of performing error correction code (ECC) encoding and a write operation on uncompressed data of FIG. 8 according to an example embodiment of the inventive concepts.
Figure 10:
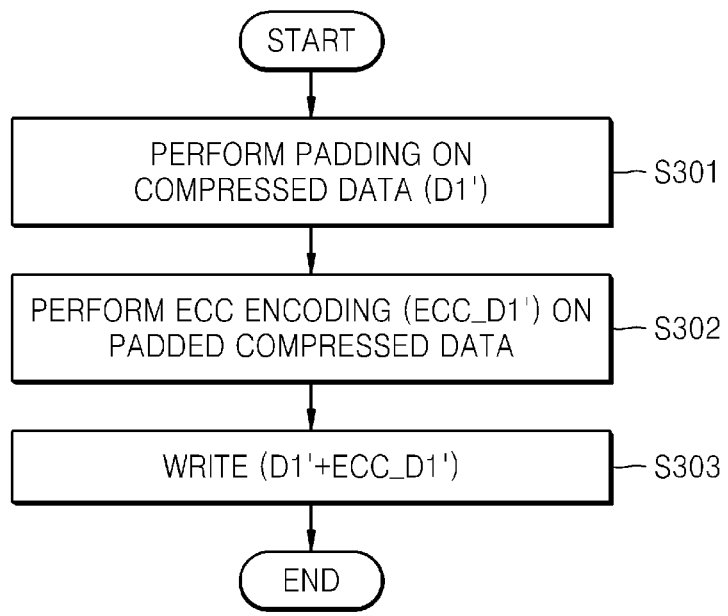
FIG. 10 is a flowchart illustrating an example of a process of performing ECC encoding and a write operation on uncompressed data of FIG. 8 according to another example embodiment of the inventive concepts.
Figure 11:
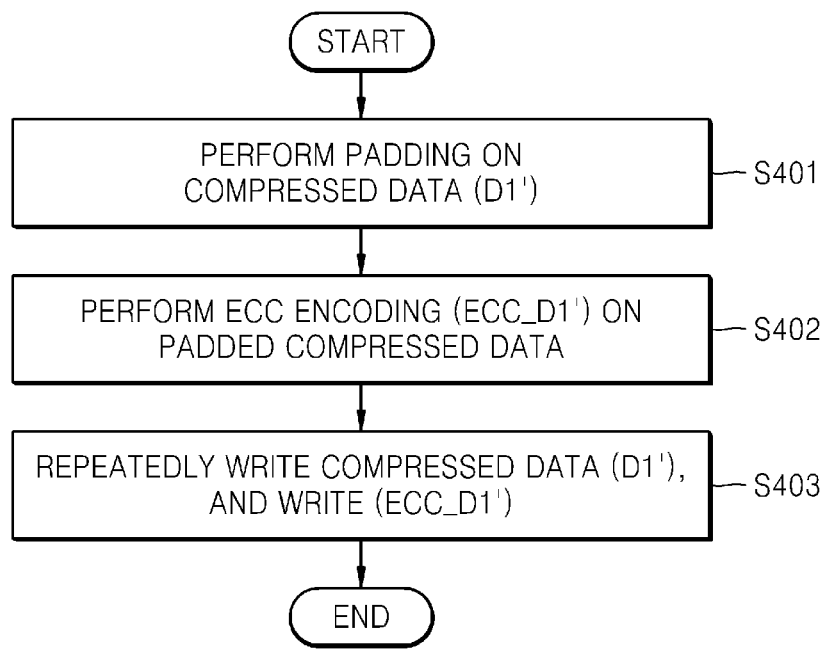
FIG. 11 is a flowchart illustrating an example of a process of performing ECC encoding and a write operation on uncompressed data of FIG. 8 according to another example embodiment of the inventive concepts.

FIG. 9 is a flowchart illustrating an example of a process of performing ECC encoding and a write operation on uncompressed data according to an example embodiment of the inventive concepts, and FIGS. 10 and 11 are flowcharts illustrating an example of processes of performing ECC encoding and a write operation on compressed data according to some example embodiments of the inventive concepts.

The process of performing ECC encoding and a write operation on uncompressed data will now be described with reference to FIG. 9.

Figure 16:
FIG. 16 including

According to the control by the control unit 121-3, the ECC processing unit 121-4 performs the ECC encoding on uncompressed data D1, and then generates an ECC_D1 (operation S201). According to the control by the control unit 121-3, data D1 having a page size to be stored in the flash memory 122' is read from the RAM 121-2 and then is delivered to the ECC processing unit 121-4 without passing through the compression processing unit 121-6. For example, data having a size such as DATA D1 shown in FIG. 16(a) is input to the ECC processing unit 121-4. The ECC processing unit 121-4 generates the ECC_D1 with respect to the DATA D1 by using an ECC algorithm such as a RS code, a Hamming code, a CRC or the like, as shown in FIG. 16(b).

According to the control by the control unit 121-3, the uncompressed data D1 and the ECC_D1 are written to a physical page of the flash memory 122' that is assigned by a translated physical address, as shown in FIG. 16(c) (operation S202). In FIG. 16(c), the ECC_D1 is stored in a spare area included in the physical page of the flash memory 122'.

The process of performing ECC encoding and a write operation on compressed data will now be described with reference to FIG. 10.

According to the control by the control unit 121-3, in order to allow a size of compressed data Dr, which is compressed by the compression processing unit 121-6, to be equal to a size of uncompressed data D1, padding is performed on the compressed data D1' by using ineffective data (operation S301). The value of all bits in the ineffective data may be initially set to 0 or 1. For example, when the uncompressed data D1 having a size shown in FIG. 17(a) is input, the size of the compressed data D1' that is compressed by the compression processing unit 121-6 is decreased to a size shown in FIG. 17(b).

The ECC processing unit 121-4 performs ECC encoding on the padded compressed data Dr, and then generates an ECC_D1' (operation S302). The padded compressed data D1' and the ECC_D1' with respect to the padded compressed data D1' have sizes as shown in FIG. 17(c). The same ECC algorithm is applied to the padded compressed data D1' and the uncompressed data D1. Thus, the size of the ECC_D1 shown in FIG. 16(b), and a size of the ECC_D1' shown in FIG. 17(c) are the same. FIG. 17(c) illustrates an example in which the compressed data D1' is padded by 0.

Figure 17:
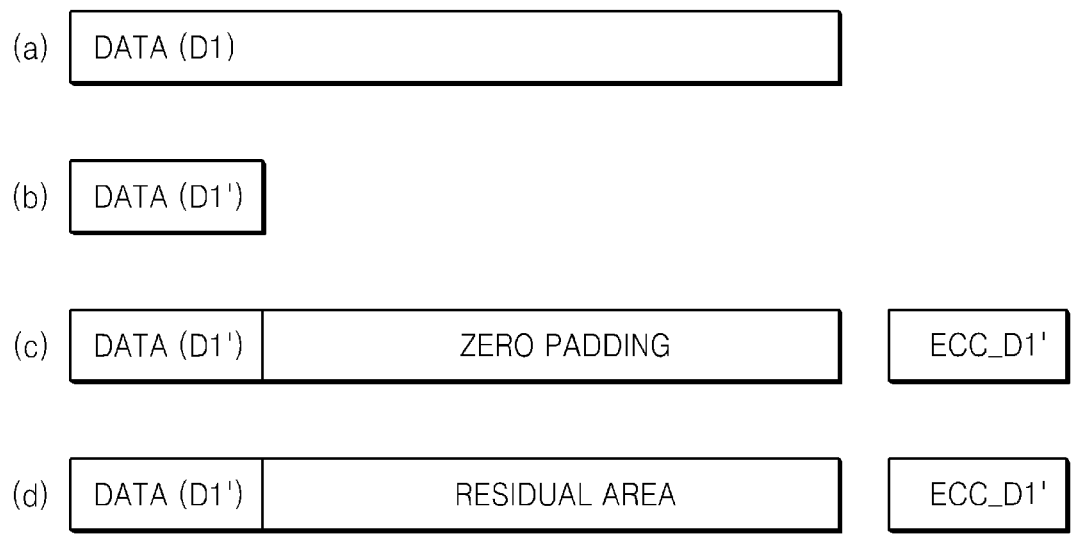
FIG. 17 including

According to the control by the control unit 121-3, the compressed data D1' and the ECC_D1' are written to a physical page of the flash memory 122' that is assigned by a physical address to which data is to be stored, as shown in FIG. 17(d) (operation S303). In FIG. 17(d), the ECC_D1' is stored in a spare area of the physical page of the flash memory 122'. Referring to FIG. 17(d), the physical page that stores the compressed data D1' has a residual area in which data is not stored and that corresponds to a size of a space achieved by data compression.

The process of performing ECC encoding and a write operation on compressed data will now be described with reference to FIG. 11.

According to the control by the control unit 121-3, in order to allow a size of compressed data Dr, which is compressed by the compression processing unit 121-6, to be equal to a size of uncompressed data D1, padding is performed on the compressed data D1' by using ineffective data (operation S401). The value of all bits in the ineffective data may be initially set to 0 or 1. When the uncompressed data D1 having a size shown in FIG. 18(a) is input, the size of the compressed data D1' that is compressed by the compression processing unit 121-6 is decreased to a size shown in FIG. 18(b).

The ECC processing unit 121-4 performs ECC encoding on the padded compressed data D1' and then generates an ECC_D1' (operation S402). The padded compressed data D1' and the ECC_D1' with respect to the padded compressed data D1' have sizes as shown in FIG. 18(c). The same ECC algorithm is applied to the padded compressed data D1' and the uncompressed data D1. Thus, the size of the ECC_D1 shown in FIG. 16(b), and a size of the ECC_D1' shown in FIG. 18(c) are the same. FIG. 18(c) illustrates an example in which the compressed data D1' is padded by 0.

According to the control by the control unit 121-3, the compressed data D1' is repeatedly written to the flash memory 122' and the ECC_D1' with respect to the compressed data D1' is written to the flash memory 122' (operation S403).

Figure 18:
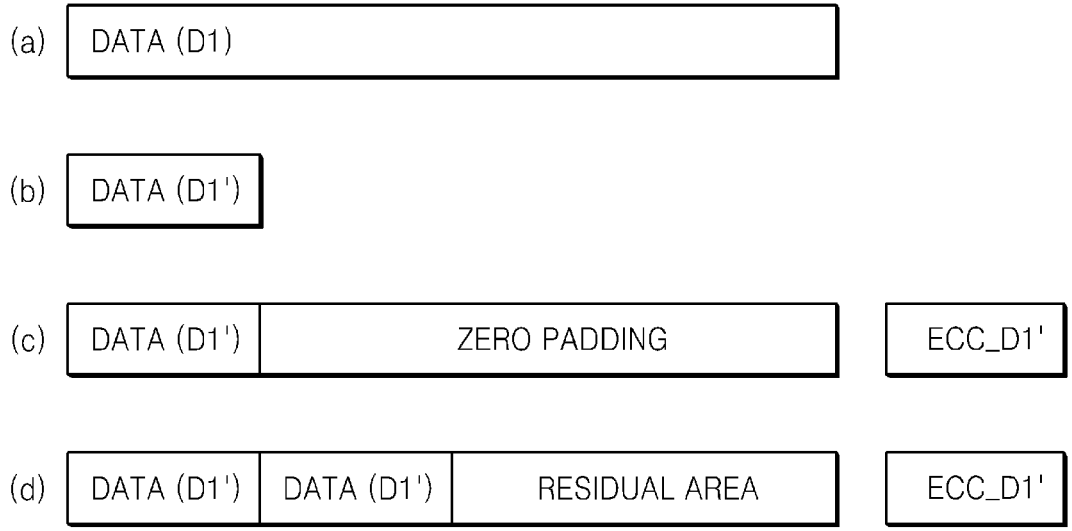
FIG. 18 including

In an example embodiment, when a data compression rate is equal to or greater than 50%, as illustrated in FIG. 18(d), the compressed data D1' is repeatedly written to a physical page of the flash memory 122' that is assigned by a translated physical address, and the ECC_D1' with respect to the compressed data D1' is written to the physical page.

Figure 19:
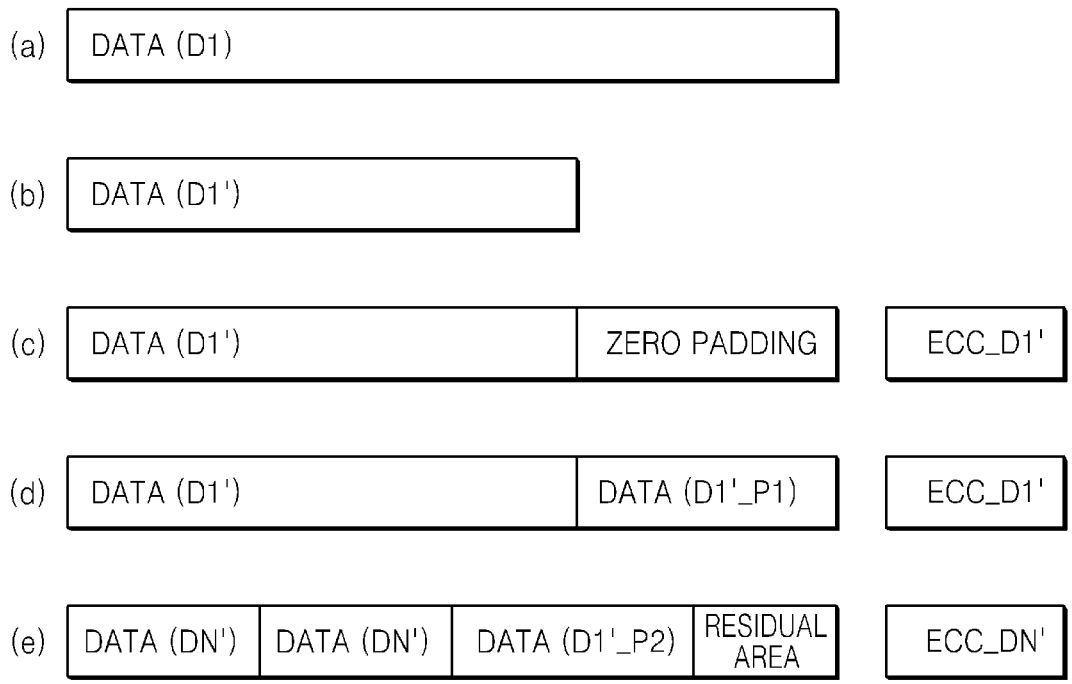
FIG. 19 including

In another example embodiment, as illustrated in FIGS. 19(a) and 19(b), when a data compression rate that is a rate of a size of uncompressed data D1 and a size of compressed data D1' is less than 50%, it is not possible to repeatedly write the compressed data D1' to one page. In this case, the control unit 121-3 divides the compressed data D1' according to a data size decreased by data compression. Accordingly, the compressed data D1' may be divided into data D1'_P1 and data D1'_P2. A size of the data D1'_P1 is the same as a data size decreased by compressing the uncompressed data D1. As illustrated in FIG. 19(d), the compressed data D1', the data D1'_P1 that is divided from the compressed data D1', and an ECC_D1' are written to a physical page of the flash memory 122' that is assigned by a translated physical address. As illustrated in FIG. 19(c), the ECC_D1' is obtained by performing ECC encoding on the compressed data D1' that is padded. As illustrated in FIG. 19(e), the data D1'_P2 that is divided from the compressed data D1' is written to a residual area of another physical page of the flash memory 122' to which another compressed data DN' that is different from the data D1'_P2 divided from the compressed data D1' is stored. Referring to FIG. 19(e), an ECC_DN' with respect to the other compressed data DN' is stored in a spare area of the physical page storing the other compressed data DN'.

As described above, the ECC encoding (operation S104) and the write operation (S105) may be performed on uncompressed data or compressed data, according to the flowcharts of FIGS. 9 through 11.

Referring to FIG. 8, after the write operation (S105) is complete, the control unit 121-3 updates metadata stored in the RAM 121-2 (operation S106). Mapping information about a storage area of the flash memory 122' that stores data is added to the metadata. For example, the mapping information about a logical address assigned by a write command and a physical address of the flash memory 122' to which data is actually written is added to the metadata. If compressed data is written to the flash memory 122', information about a physical storage area of the flash memory 122' to which the compressed data is written is added to the metadata. If the compressed data is repeatedly stored in the flash memory 122', information about a physical position of the flash memory 122' to which the compressed data is repeatedly stored is added to the metadata. While a write operation is performed, if a value from among values of factors included in the metadata is changed, the metadata is updated. For example, a program count value with respect to a storage area to which a write operation is performed is updated.

Figure 20:
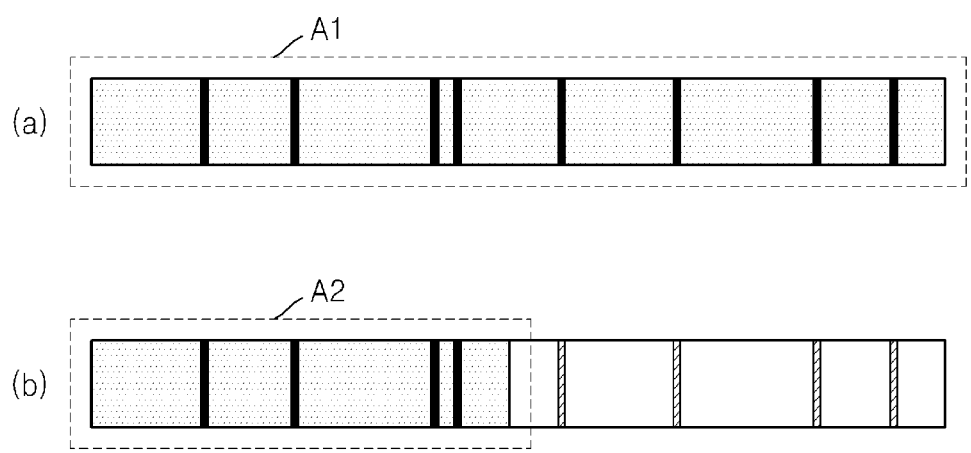
FIG. 20 including

FIG. 20(a) illustrates an example in which data is stored in a physical page of the flash memory 122' without compressing the data, and FIG. 20(b) illustrates an example in which data is compressed and then is stored in a physical page of the flash memory 122'.

Referring to FIGS. 20(a) and 20(b), a size of a physical area storing uncompressed data is A1 and a size of physical area storing compressed data is A2. Bold lines in FIGS. 20(a) and 20(b) indicate bit positions in which an error occurs. It is possible to see that an error occurs in 4 bits in the example of FIG. 20(b) in which the data is compressed and then stored, compared to the example of FIG. 20(a) in which the data is stored without compression and an error occurs in 8 bits. Thus, a possibility of error occurrence may be decreased by compressing and storing the data.

A method of enhancing an error correction performance according to another example embodiment of the inventive concepts will now be described with reference to FIGS. 3 and 12.

The control unit 121-3 determines whether a read command is received via the host interface 121-1 (operation S501).

When the read command is received, the control unit 121-3 translates a logical address assigned by the read command into a physical address by using metadata stored in the RAM 121-2 (operation S502).

The control unit 121-3 determines whether a storage area of the flash memory 122' including a physical address to be accessed is an area storing compressed data, by using the metadata (operation S503). Metadata stored in the RAM 121-2 includes information about a storage area of the flash memory 122' that stores compressed data. Thus, it is possible to determine whether the storage area including the physical address translated in operation S502 is the area that stores the compressed data, by using the metadata.

As a result of the determination in operation S503, if the storage area does not correspond to the area that stores the compressed data, the control unit 121-3 checks a deterioration status of a physical area of the flash memory 122' from which data is to be read (operation S504). For example, the control unit 121-3 may check a deterioration status of a page, a block or a plane based on the metadata stored in the RAM 121-2, wherein the page, the block or the plane corresponds to the physical address translated in operation S502. For example, the deterioration status may be checked based on an error bit count value, an erase count value or a program/read count value for the page, the block, or the plane that is included in the metadata.

The control unit 121-3 compares the deterioration status checked in operation S504 with a threshold value TH1 (operation S505). The threshold value TH1 may be set as a value having a certain margin value in a maximum deterioration status in which error correction is guaranteed by an ECC algorithm applied to the storage device 120.

As a result of the comparison in operation S505, if the deterioration status is equal to or greater than the threshold value TH1, a data read operation is performed (operation S506). For example, according to a control by the control unit 121-3, the data and an ECC are read from the physical page of the flash memory 122' that is assigned by the physical address translated in operation S502, the data and the ECC are stored in the RAM 121-2, and then error detection and correction processing is performed on the data by using the ECC.

The control unit 121-3 performs a refresh operation in which the data read from the storage area of which deterioration status is equal to or greater than the threshold value TH1 according to the result of the comparison in operation S505 is written to the flash memory 122' (operation S507). For example, in the refresh operation, the data that is read from the storage area with a deterioration status equal to or greater than the threshold value TH1 may be written to a new physical area of the flash memory 122' to which no data is written. The storage area with deterioration status equal to or greater than the threshold value TH1 becomes ineffective. In the refresh operation, the storage area of the flash memory 122' whose data is read may be erased and then the data may be compressed and written to an erased area.

The refresh operation may be performed in a manner of operations S101 through S105 of FIG. 8.

As the result of the determination in operation S503, if the storage area of the flash memory 122' that includes the physical address to be accessed corresponds to the area that stores the compressed data or as the result of the comparison in operation S505, if the deterioration status is less than the threshold value TH1, a data read operation is performed by reading the data from the storage area of the flash memory 122' that is assigned by the physical address translated in operation S502 and then by decoding the data (operation S508).

After performing operation S507 or operation S508, the control unit 121-3 updates the metadata stored in the RAM 121-2 (operation S509). Mapping information about a storage area of the flash memory 122' to which the data is written by the refresh operation is added to the metadata. In addition, information about the physical storage area of the flash memory 122' to which the compressed data is written is added to the metadata. If the compressed data is repeatedly stored in the flash memory 122', information about a physical position of the flash memory 122' to which the compressed data is repeatedly stored is added to the metadata. While the read operation or the write operation is performed, if a value from among values of factors included in the metadata is changed, the metadata is updated.

Figure 12:
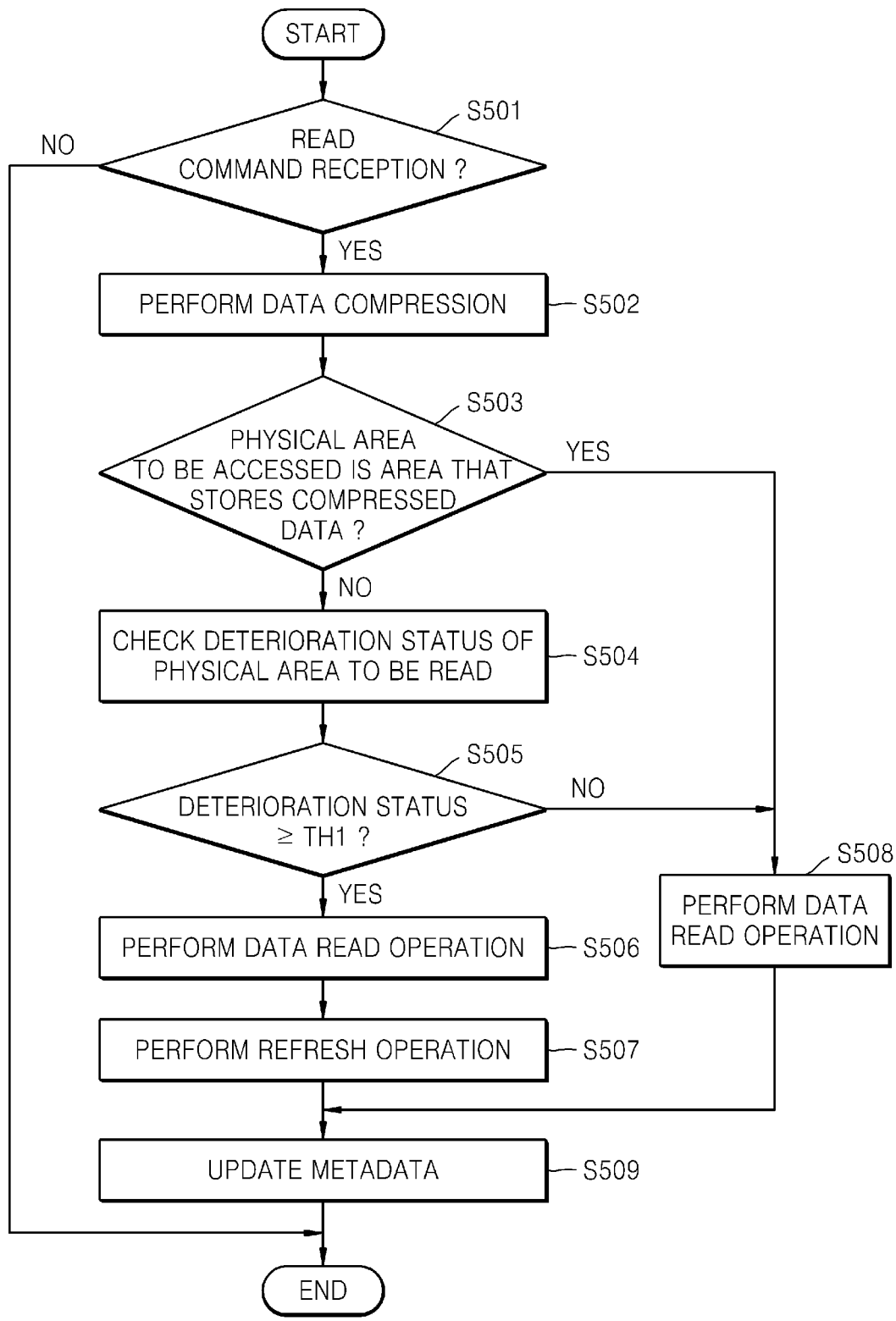
FIG. 12 is a flowchart illustrating an example of a method of enhancing an error correction performance according to another example embodiment of the inventive concepts.

Operation 508 of FIG. 12 is performed to decode the compressed data and will now be described in detail with reference to FIGS. 13 and 14.

Figure 13:
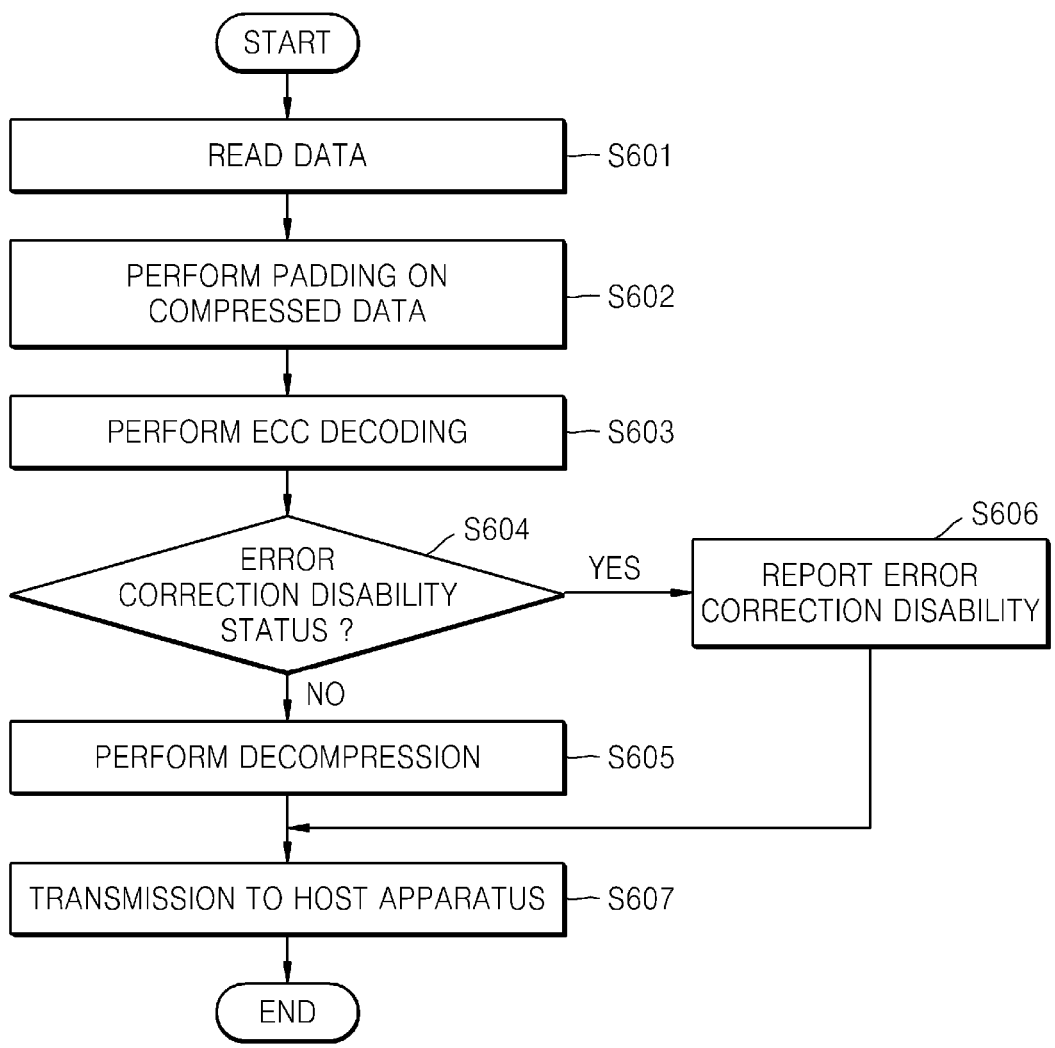
FIG. 13 is a flowchart illustrating an example of a data read process of when the compressed data is not repeatedly written to the flash memory according to an example embodiment of the inventive concepts.
Figure 14:
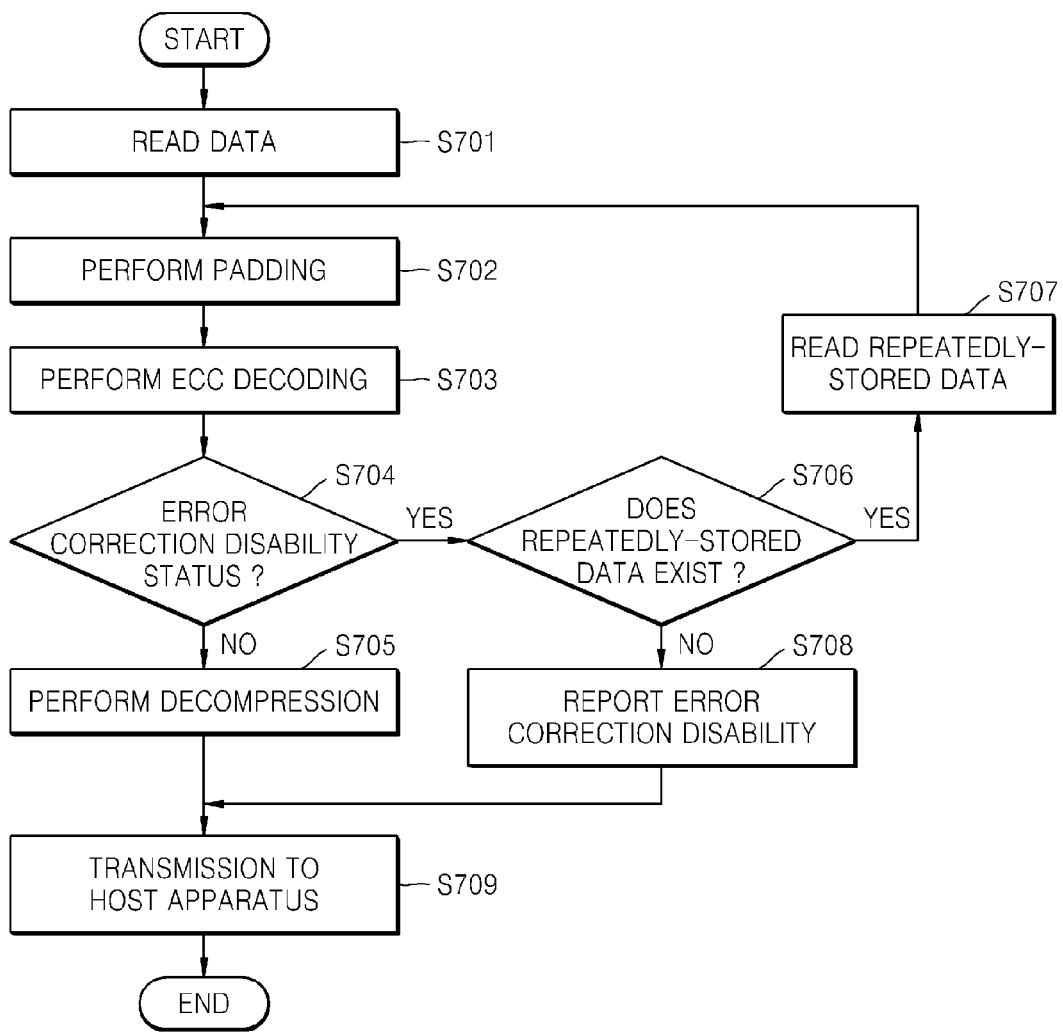
FIG. 14 is a flowchart illustrating an example of a data read process of when the compressed data is not repeatedly written to the flash memory according to another example embodiment of the inventive concepts.

FIG. 13 is a flowchart illustrating an example of a data read process when the compressed data is not repeatedly written to the flash memory 122', according to an example embodiment of the inventive concepts. FIG. 14 is a flowchart illustrating an example of a data read process when the compressed data is repeatedly written to the flash memory 122', according to another example embodiment of the inventive concepts.

The data read process when the compressed data is not repeatedly written to the flash memory 122' will now be described with reference to FIGS. 3 and 13.

According to a control by the control unit 121-3, data and an ECC with respect to the data are read from a physical page of the flash memory 122' that is assigned by a physical address translated based on metadata, and the data and the ECC are stored in the RAM 121-2 (operation S601).

If the data read from the RAM 121-2 is compressed data, the compressed data is padded according to the control by the control unit 121-3 and then is output to the ECC processing unit 121-4 (operation S602). A padding size is decided to satisfy a condition by which a size of uncompressed data and a size of the compressed data become equal. The value of all bits of the ineffective data that is added for the padding may be initially set to 0 or 1.

The ECC processing unit 121-4 performs ECC decoding on the padded compressed data (operation S603). For example, the ECC processing unit 121-4 performs error detection and correction processing on the padded compressed data based on the ECC, by using an ECC algorithm. By performing the ECC decoding on the compressed data, an effective data size of a data period to which the ECC is applied is decreased, so that an ECC decoding strength is increased.

After performing the ECC decoding, the control unit 121-3 determines whether an error correction disability status occurs (operation S604). For example, if an error bit occurs and the error bit that exceeds a range of an error that may be corrected by the ECC algorithm, the control unit 121-3 determines the case as the ECC correction disability status. For example, when an ECC algorithm that processes a bit error of 1024 byte data by a level equal to or less than 16 bit is used, if a bit error occurring in the 1024 byte data exceeds 16 bit, the control unit 121-3 determines the case as the error correction disability status.

As a result of the determination in operation S604, if the error correction disability status does not occur, the decompression processing unit 121-7 performs a restoring process of restoring the ECC decoding processed compressed data to a state before the compression, according to the control by the control unit 121-3 (operation S605).

As the result of the determination in operation S604, if the error correction disability status occurs, information for reporting error correction disability is generated according to the control by the control unit 121-3 (operation S606).

According to the control by the control unit 121-3, the decompressed data or the information for reporting error correction disability is transmitted to the host apparatus 110 via the host interface 121-1 (operation S607).

The data read process of when the compressed data is repeatedly written to the flash memory 122' will now be described with reference to FIGS. 3 and 14.

According to a control by the control unit 121-3, data and an ECC with respect to the data are read from a physical page of the flash memory 122' that is assigned by a physical address translated based on metadata, and the data and the ECC are stored in the RAM 121-2 (operation S701).

If the data read from the RAM 121-2 is compressed data, the compressed data is padded according to the control by the control unit 121-3 and then is output to the ECC processing unit 121-4 (operation S702). A padding size is decided to satisfy a condition by which a size of uncompressed data and a size of the compressed data become equal. The value of all bits in the ineffective data that is added for the padding may be initially set to 0 or 1.

The ECC processing unit 121-4 performs ECC decoding on the padded compressed data (operation S703). For example, the ECC processing unit 121-4 performs error detection and correction processing on the padded compressed data based on the ECC, by using an ECC algorithm. By performing the ECC decoding on the compressed data, an effective data size of a data period to which the ECC is applied is decreased, so that an ECC decoding strength is increased.

After performing the ECC decoding, the control unit 121-3 determines whether an error correction disability status occurs (operation S704). For example, if an error bit occurs and the error bit that exceeds a range of an error that may be corrected by the ECC algorithm, the control unit 121-3 determines the case as the error correction disability status.

As a result of the determination in operation S704, if the error correction disability status does not occur, the decompression processing unit 121-7 performs a restoring process of restoring the ECC decoding processed compressed data to a state before the compression, according to the control by the control unit 121-3 (operation S705).

As the result of the determination in operation S704, if the error correction disability status occurs, the control unit 121-3 determines whether data having the error correction disability status is repeatedly stored in the flash memory 122', by referring to metadata stored in the RAM 121-2 (operation S706).

As a result of the determination in operation S706, if the data is repeatedly stored in the flash memory 122', the control unit 121-3 reads the repeatedly stored data from a physical area of the flash memory 122' by referring to the metadata, and stores it in the RAM 121-2 (operation S707). After operation S707 is performed, the data read process is performed again from operation S702.

As the result of the determination in operation S706, if the repeatedly stored data does not exist in the flash memory 122', information for reporting error correction disability is generated according to the control by the control unit 121-3 (operation S708).

According to the control by the control unit 121-3, the decompressed data or the information for reporting error correction disability is transmitted to the host apparatus 110 via the host interface 121-1 (operation S709).

A method of enhancing an error correction performance according to another example embodiment of the inventive concepts will now be described with reference to FIGS. 3 and 15.

The control unit 121-3 determines whether a write command is received via the host interface 121-1 (operation S801).

When the write command is received, the control unit 121-3 translates a logical address assigned by the write command into a physical address by using metadata stored in the RAM 121-2 (operation S802).

The control unit 121-3 checks a deterioration status of a physical area of the flash memory 122' to which data is to be stored (operation S803). For example, the control unit 121-3 may check a deterioration status of a page, a block or a plane based on the metadata stored in the RAM 121-2, wherein the page, the block or the plane corresponds to the physical address of the flash memory 122' to which data is to be stored. For example, the deterioration status may be checked based on an error bit count value, an erase count value or a program/read count value for the page, the block or the plane that is to read data included in the metadata.

The control unit 121-3 compares the deterioration status checked in operation S803 with a threshold value TH2 (operation S804). The threshold value TH2 may be set as a value having a certain margin value in a maximum deterioration status in which error correction is guaranteed by an ECC algorithm applied to the storage device 120. The threshold value TH2 applied to a write operation may be equal to or different from the threshold value TH1 applied to the read operation of FIG. 12.

As a result of the comparison in operation S804, if the deterioration status is equal to or greater than the threshold value TH2, data compression is performed according to the control by the control unit 121-3 (operation 805). ECC encoding is performed according to the control by the control unit 121-3 (operation 806). The control unit 121-3 updates the metadata stored in the RAM 121-2 (operation S808).

Figure 15:
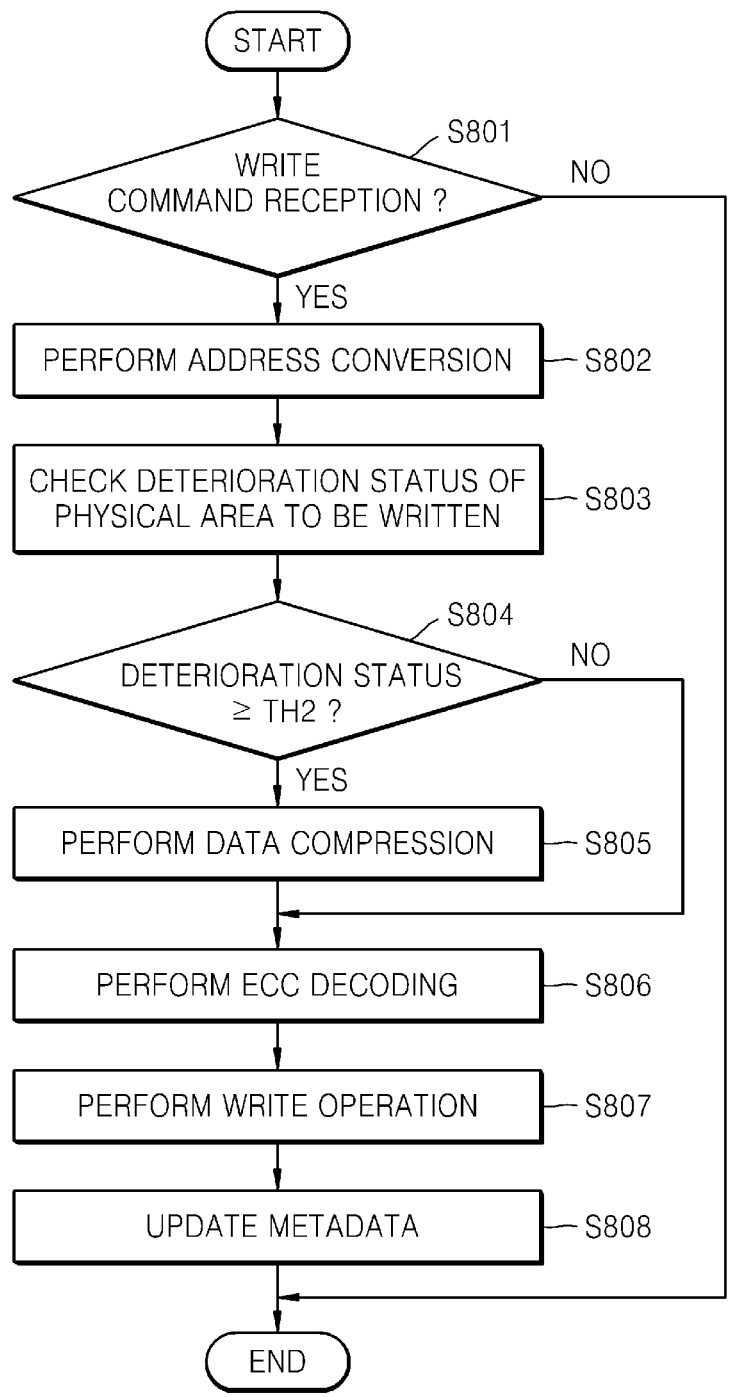
FIG. 15 is a flowchart illustrating an example of a method of enhancing an error correction performance according to another example embodiment of the inventive concepts.

Operations S805 through S808 shown in FIG. 15 are substantially the same as operations S103 through S106 shown in FIG. 8, thus, detailed descriptions thereof are omitted here.

Figure 21:
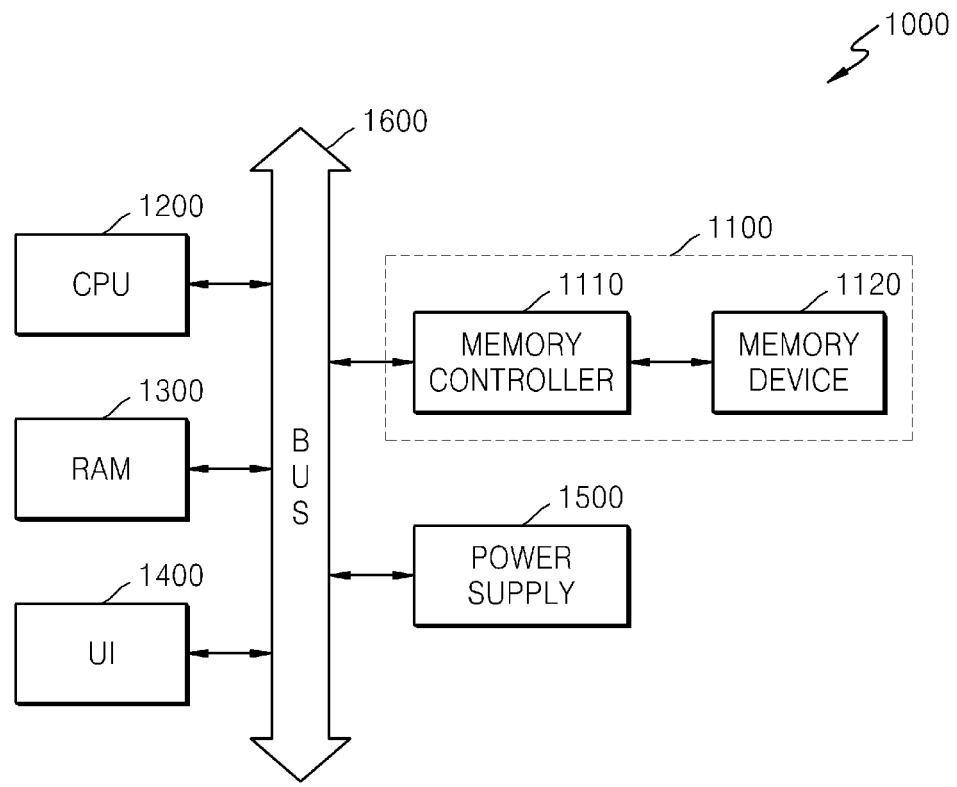
FIG. 21 is a block diagram illustrating an example of a computer system according to an example embodiment of the inventive concepts.

FIG. 21 is a block diagram illustrating an example of a computer system 1000 according to an example embodiment of the inventive concepts.

The computer system 1000 includes a processor (i.e., a CPU) 1200, a RAM 1300, a UI 1400, and a storage device 1100. The storage device 1100 includes a memory controller 1110 and a memory device 1120. Data that is processed or is to be processed by the processor 1200 is stored in the memory device 1120 via the memory controller 1110. The storage device 1100 of FIG. 21 may be formed as the storage device 120. The computer system 1000 may further include a power supply 1500.

If the computer system 1000 is a mobile device, the power supply 1500 of the computer system 1000 may be a battery, and a modem such as a baseband chipset may be additionally provided to the computer system 1000. It is obvious to one of ordinary skill in the art that an application chipset, a camera image processor (CIS), a mobile DRAM or the like may be further provided to the computer system 1000, thus, detailed descriptions thereof are omitted here.

Figure 22:
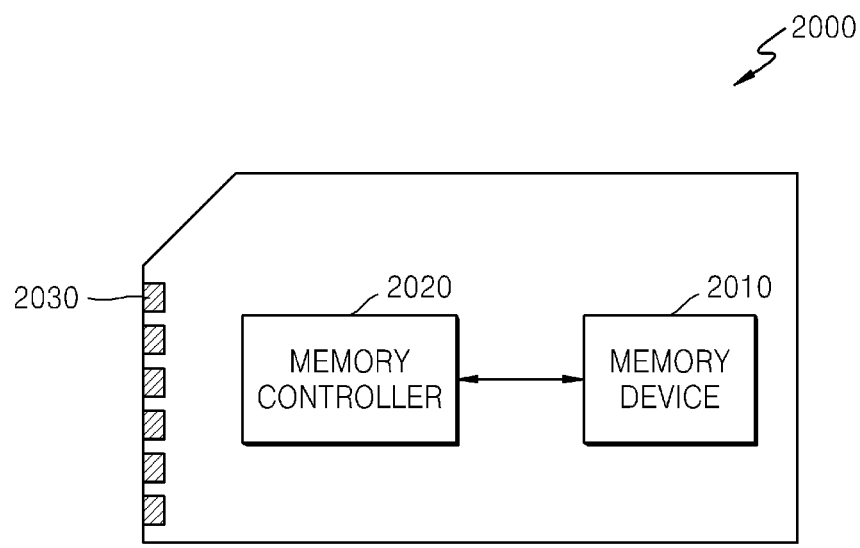
FIG. 22 is an example of a block diagram of a memory card according to an example embodiment of the inventive concepts.

FIG. 22 is a block diagram illustrating an example of a memory card 2000 according to an example embodiment of the inventive concepts.

Referring to FIG. 22, the memory card 2000 includes a memory controller 2020 and a memory device 2010. The memory controller 2020 controls a data write operation or a data read operation with respect to the memory device 2010, in response to a request of an external host that is received via an input/output (I/O) means 2030. In order to perform the control operation, the memory controller 2020 of the memory card 2000 may include an interface, a RAM, and the like that perform interfacing with each of a host and the memory device 2010. The memory card 2000 may be formed as the storage device 120 of FIG. 1.

The memory card 2000 of FIG. 22 may be formed as a compact flash card (CFC), a micro drive, a smart media card (SMC), a multimedia card (MMC), a security digital card (SDC), a memory stick, an USB flash memory driver or the like.

Figure 23:
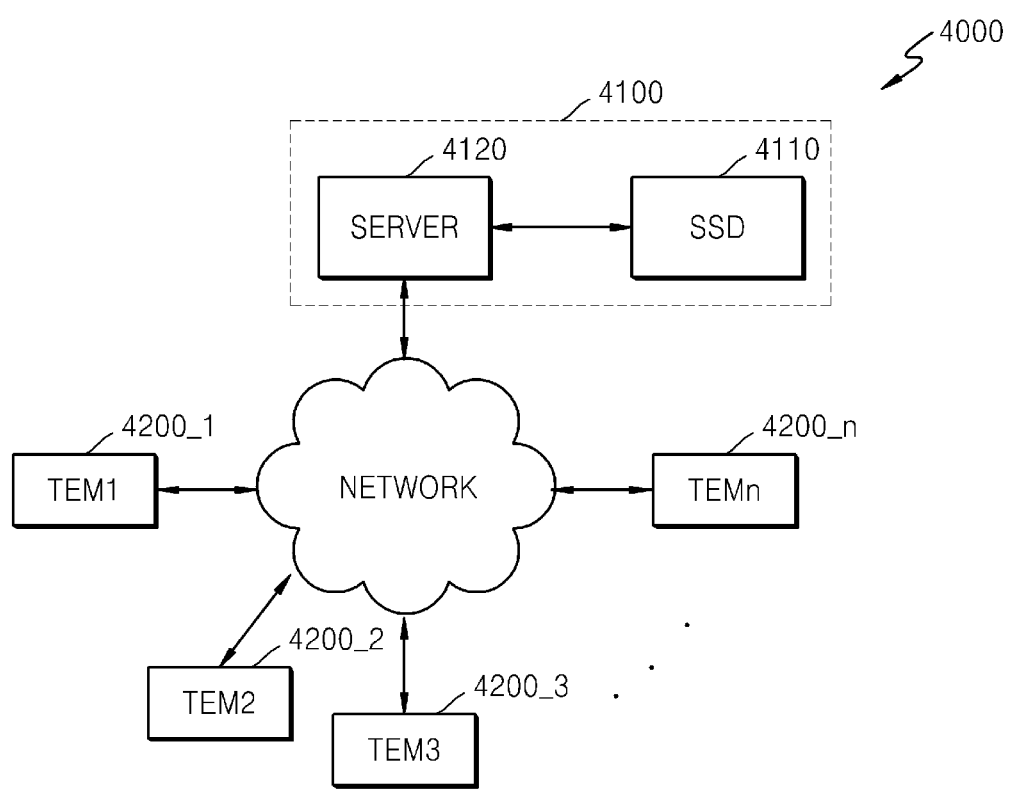
FIG. 23 illustrates an example of a network system including one of the data storage systems according to an example embodiment of the inventive concepts.

FIG. 23 illustrates an example of a server system 4100 including a SSD 4110, and a network system 4000 including the server system 4100, according to an example embodiment of the inventive concepts.

Referring to FIG. 23, the network system 4000 may include the server system 4100 and a plurality of terminals 4200_1 through 4200_n that are connected via a network. The server system 4100 may include a server 4120 for processing a request from the terminals 4200_1 through 4200_n connected to the network, and the SSD 4110 for storing data corresponding to the request from the terminals 4200_1 through 4200_n. The SSD 4110 of FIG. 23 may be formed as the storage device 120 according to the one or more example embodiments of the inventive concepts.

The flash memory system described in the above may be mounted by using a package having one of various forms. For example, the flash memory system may be mounted by using one of packages including a package on package (POP), BGAs (ball grid arrays), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metricquad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP), a wafer-level processed stack package (WSP), and the like.

While example embodiments of the inventive concepts have been particularly shown and described with reference to example embodiments, it will be understood that various changes in form and details may be made therein without departing from the spirit and scope of the following claims.

What is claimed is:

1. A method of enhancing an error correction performance, the method comprising:
   determining a deterioration status of a physical area of a memory device to which data is to be stored; and
   compressing data and storing the compressed data and an error correction code (ECC) with respect to the compressed data in an area of which the deterioration status is equal to or greater than a threshold value that is initially set; and
   storing uncompressed data and an ECC with respect to the uncompressed data in an area of which the deterioration status is less than the threshold value.

2. The method of claim 1, wherein a size of the ECC stored in the area of which the deterioration status is equal to or greater than the threshold value, and a size of the ECC stored in the area of which the deterioration status is less than the threshold value are the same.

3. The method of claim 1, wherein determining a deterioration status determines the deterioration status by at least one of a unit of page, a unit of block and a unit of plane of the memory device to which the data is to be stored.

4. The method of claim 1, wherein determining a deterioration status determines the deterioration status based on at least one of error bit information, program/erase cycle information and program/read count information.

5. The method of claim 1, wherein if the deterioration status of the physical area of the memory device that corresponds to a physical address to which the data is to be stored is less than the threshold value, the storing includes,
   generating a first ECC with respect to the data, and
   writing the data and the first ECC to a storage area of the memory device that is assigned by the physical address.

6. The method of claim 1, wherein if the deterioration status of the physical area of the memory device that corresponds to a physical address to which the data is to be stored is equal to or greater than the threshold value, the storing includes,
   compressing the data;
   performing a padding operation on the compressed data by including ineffective data that is initially set, to allow a size of the compressed data and a size of the uncompressed data to be equal to each other;
   generating a second ECC with respect to the compressed data that is padded; and
   writing the compressed data and the second ECC to a storage area of the memory device that is assigned by the physical address.

7. The method of claim 6, wherein the performing a padding operation initially sets the value of all bits in the ineffective data to 0.

8. The method of claim 6, wherein the compressing data and storing the compressed data includes repeatedly writing compressed data to a plurality of different positions in a page assigned by the physical address.

9. The method of claim 6, wherein the compressing data and storing the compressed data includes repeatedly writing compressed data to a first page assigned by the physical address and a second page different from the first page.

10. The method of claim 1, further comprising:
    storing information as metadata, wherein the information is related to an area of the memory device of which the deterioration status is equal to or greater than the threshold value.

11. A method of enhancing an error correction performance, the method comprising:
    determining a deterioration status of a physical area of a memory device; and
    compressing data and storing the compressed data and an error correction code (ECC) to the physical area if the deterioration status of the physical area is equal to or greater than a threshold value; and
    storing uncompressed data and an ECC to the physical area if the deterioration status of the physical area is less than the threshold value.

12. The method of claim 11, wherein a size of the ECC stored if the deterioration status is equal to or greater than the threshold value is the same as a size of the ECC stored if the deterioration status is less than the threshold value.

13. The method of claim 11, wherein the determining a deterioration status determines the deterioration status based on at least one of error bit information, program/erase cycle information and program/read count information.

14. The method of claim 11, wherein if the deterioration status of the physical area is less than the threshold value, the storing includes,
   generating a first ECC with respect to the data, and
   writing the data and the first ECC to a storage area of the memory device that is assigned by the physical address.

15. The method of claim 14, wherein if the deterioration status of the physical area is equal to or greater than the threshold value, the storing includes,
   compressing the data,
   performing a padding operation on the compressed data by including ineffective data that is initially set, to allow a size of the compressed data and a size of the uncompressed data to be equal to each other,
   generating a second ECC with respect to the compressed data that is padded, and
   writing the compressed data and the second ECC to a storage area of the memory device that is assigned by the physical address.

\* \* \* \* \*